United States Patent [19]

Saint-Cyr

[11] Patent Number: 4,879,589
[45] Date of Patent: Nov. 7, 1989

[54] HERMETIC LEADLESS SEMICONDUCTOR DEVICE PACKAGE

[75] Inventor: Frederic Saint-Cyr, Signal Hill, Calif.

[73] Assignee: Semetex Corporation, Torrance, Calif.

[21] Appl. No.: 148,017

[22] Filed: Jan. 25, 1988

[51] Int. Cl.$^4$ .............................................. H01L 23/42
[52] U.S. Cl. ......................................... 357/79; 357/74; 357/68
[58] Field of Search ......................... 357/74, 79, 71, 68

[56] References Cited
U.S. PATENT DOCUMENTS 4,021,839  5/1977  Denlinger .............................. 357/79

Primary Examiner—Andrew J. James
Assistant Examiner—Mark Prenty
Attorney, Agent, or Firm—Freilich, Hornbaker Rosen & Fernandez

[57] ABSTRACT

An hermetic leadless package for a planar p-n, Schottky or other diode has a planar base and cover made of electrically conductive metal in order to serve as the contacts of the diode necessary to connect it to a circuit. A spacing frame constructed from dielectric material, such as alumina, separates the base and cover and provides a cavity for receiving a diode connected electrically to the cover by welding the short end of a J-shaped contact to the cover, and soldering the long end of the contact to one side of the diode chip. The other side of the diode chip is soldered to the base. The package is stacked for soldering by placing a sheet of preformed solder over the base, placing the spacing frame over the solder sheet, and placing a ring of preformed solder over the spacing frame. Once the diode chip is affixed to the cover, the cover is placed over the stack with the diode chip in the cavity created by the spacing frame. The stack is then placed in a graphite boat, which in turn is placed in an evacuated oven. Voidless soldering is then achieved by electrical resistive heating of the boat to a temperature necessary to melt the solder preforms.

6 Claims, 3 Drawing Sheets

HERMETIC LEADLESS SEMICONDUCTOR DEVICE PACKAGE

BACKGROUND OF THE INVENTION

This invention relates to packaging doides, and more particularly to hermetic leadless packaging of p-n, Schottky, and other planar diodes. This concept could also be extended to three lead packages for devices like transistors.

It is known to place p-n, Schottky, and other planar diodes in hermetic packages to facilitate their use. However, the known packages have various disadvantages due to large parasitic capacitance, inductance, and thermal resistance caused by their bulky multilayer construction, especially in high frequency circuit applications. Such packages use copper for diode contacts which has a poor thermal match to the diode, or use alloys for the diode which contain Ni and therefore exhibit significant resistance and inductance. A poor thermal match results in the solder connection between the contact and the diode separating or the diode cracking during temperature cycling.

It is generally known to use C- or S-shaped spring contacts to provide for stress relief in the vertical direction, but if there is not a good thermal match between the contact metal and the diode semiconductor, there is a possibility of diode delamination or cracking. The term "delamination" used hereinafter refers to the breaking loose of the connection between the contact and the diode which may occur regardless of how the connection (ohmic contact) is made to the diode.

SUMMARY OF THE INVENTION

In accordance with the present invention, an hermetic, leadless low profile (100 mils thick) package is provided for planar semiconductor devices comprising an electrically conductive base plate and cover or lid, and a nonconductive frame to separate the base plate and cover. The frame forms a cavity in the package suitable for receiving a device connected to the cover by a J-shaped spring contact made from laminated Cu-Mo-Cu. The J-shaped spring contact is afixed to the device with a short end secured by spot welding in ohmic contact with the molybdenum cover, while the longer end of the spring contact is affixed by solder in contact with the other side of the device.

The package is assembled by stacking on the base a sheet of solder preform, the frame, and a ring of solder that is preformed to just fit under the frame. The cover is then inverted and placed over this stack with the device suspended from the cover by the J-shaped spring contact. The cover seats over the ring of solder, and the J-shaped spring contact will have sufficient compression to assure that the bottom end of the device is in contact with the sheet of solder. The assembly is then placed in a graphite boat to heat the assembly by electric resistance heating of the boat after it is placed in an evacuated oven. The frame is thus soldered to the base plate and the cover is soldered to the frame, while the bottom side of the device is soldered to the base plate which is made of molybdenum. A weight may be placed over the stacked package while it is in the boat to assure sufficient pressure between the parts during the soldering process, resulting in a void free solder interface between the parts.

A particularly advanageous feature of the invention is that the material of the J-shaped contact is a Cu-Mo-Cu lamination so that the coefficient of thermal expansion of the lamination is closely matched to the semiconductor device. This thermal-expansion matching is achieved by using a very thin film of copper on at least the side of the molybdenum to be soldered to the device. The thin copper film assures an ohmic contact with the device, but it is so thin that the thermal expansion properties of the contact is essentially that of the molybdenum itself, which matches the thermal expansion properties of the device sufficiently to avoid delamination.

The novel features that are considered characteristic of this invention are set forth with particularity in the appended claims. The invention will best be understood from the following description when read in connection with the accompanying drawings.

BRIEF DESCRIPTION OF THE DRAWINGS

FIG. 1b is an exploded perspective view showing the package of FIG. 1a.

DESCRIPTION OF PREFERRED EMBODIMENTS

Figure 1A:
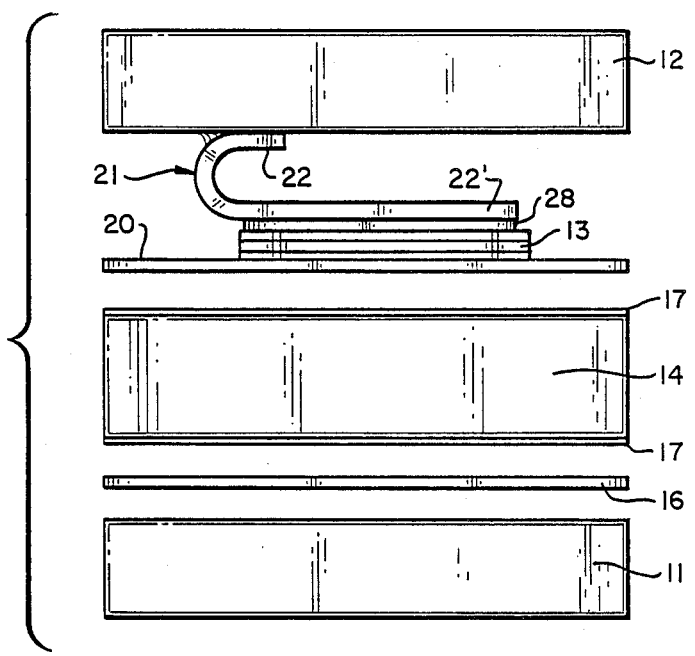
FIG. 1a is an exploded elevational view showing a package according to the present invention.
Figure 1B:
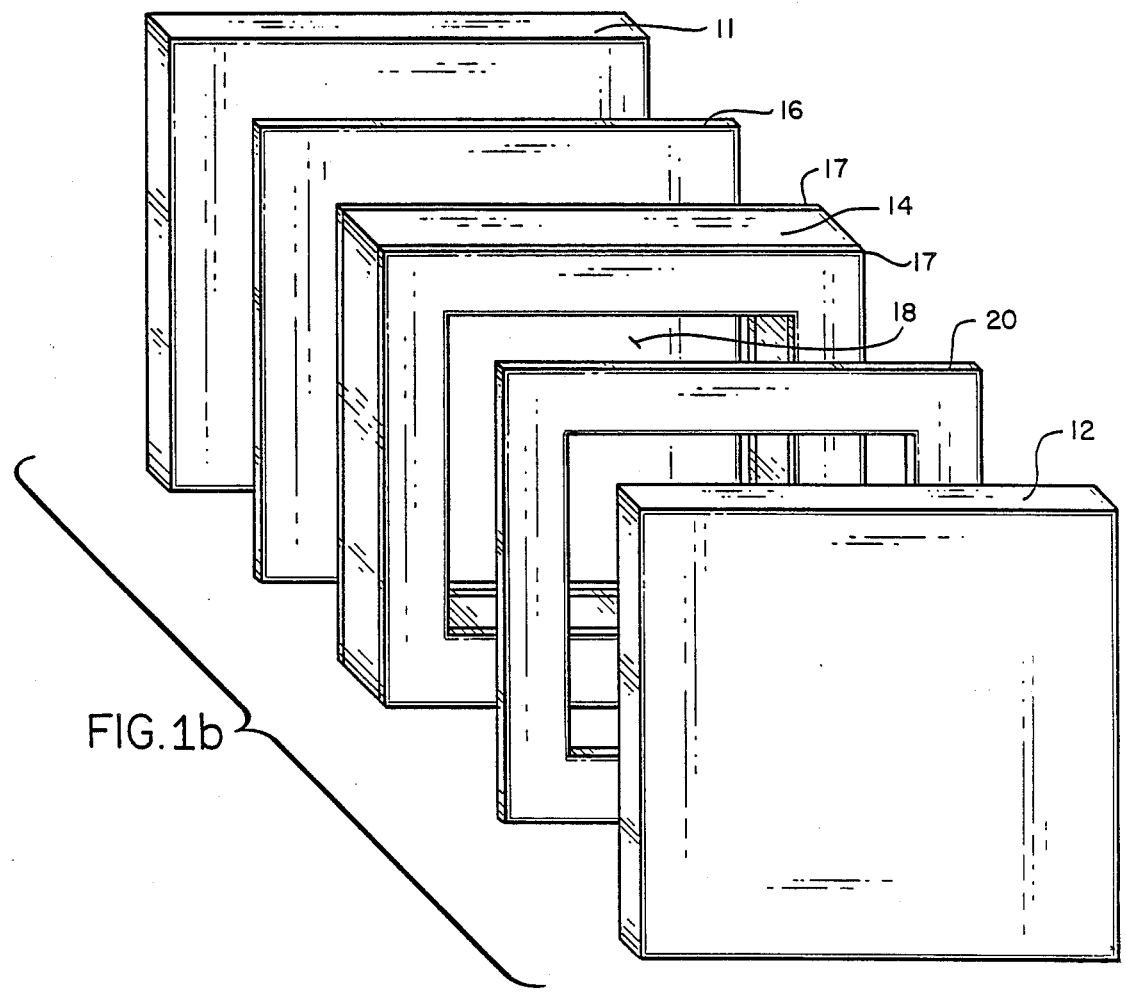

Referring to FIGS. 1a and 1b of the drawings, an hermetic, leadless package assembly 10 shown in an exploded view includes a base plate 11 and a cover 12, each formed from a suitable electrically conductive material. Since the base plate 11 and the cover 12 form the contacts for the assembled diode package, at least the base plate should be formed from a conductive material having a coefficient of thermal expansion that is closely matched to a diode chip 13 to be packaged, such as molybdenum.

A dielectric spacing frame 14 is placed between the base plate 11 and cover 12 to electrically isolate the cover from the base plate. A sheet of solder 16 is placed between the frame and the base plate. The solder is preferably 92.5% lead, 5% indium, and 2.5% silver. The frame 14, which is preferably constructed from alumina, is provided with metalized seal rings 17 on top and bottom, as shown in FIG. 1a. The thickness of the frame 14 is selected to space the cover from the base plate to form a cavity 18, shown in FIG. 1b, of sufficient depth for receiving the diode to be packaged. A ring of preformed solder 20 (similar to the solder preform 16 except for a window or cutout shown in FIG. 1b) is dimensioned to support the cover along the edges of the base plate. Once the solder preforms 16 and 20 are heated in an evacuated oven to solder the cover and base plate to the dielectric frame 14, the diode chip 13 placed in the cavity is hermetically sealed, as will become more apparent from a description of FIGS. 2a-2e and FIG. 4.

Figure 2A:
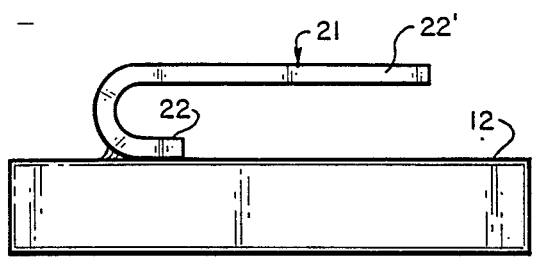
FIGS. 2a through 2e illustrate the sequence of steps necessary for assembling an hermetic diode package according to FIGS. 1a and 1b.
Figure 3:
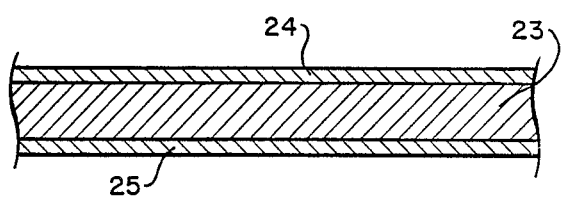
FIG. 3 illustrates a cross section of a laminate for a preferred embodiment of a C-shaped contact shown in FIG. 2.

FIG. 2a illustrates diagrammatically the first step of assembling the diode package 10. A J-shaped spring contact 21 is preformed by conventional means and affixed to a surface of the cover 12 at a short leg 22 in a conventional manner, such as by welding, brazing, or the like. The contact 21 is preferably constructed as a laminate shown in FIG. 3 and formed in a conventional manner by pressure rollers.

In practice, a strip of molybdenum 23 is laminated on both sides with very thin copper sheets 24 and 25, and then cut to the desired length and width and formed into a J-shaped contact. This copper clad molybdenum contact structure has been found to have a coefficient of thermal expansion sufficiently well matched to silicon diode chips to provide stress relief in all dimensions. Prior art C- or J-shaped copper contacts relieve stress only in the vertical direction, and thus allow for the possibility of the diode chip 13 cracking or separating from the contact 21.

Figure 2B:
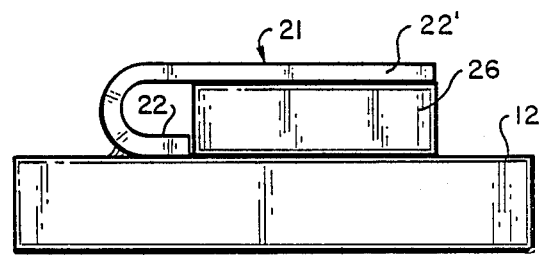
Figure 2C:
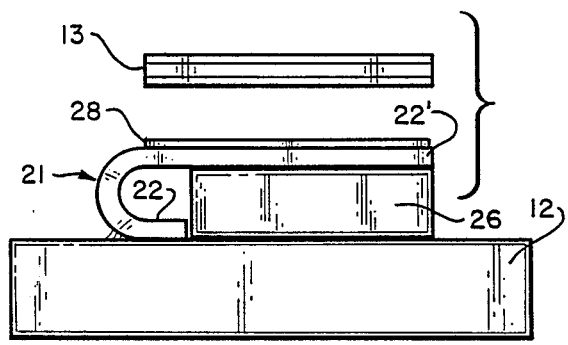
Figure 2D:
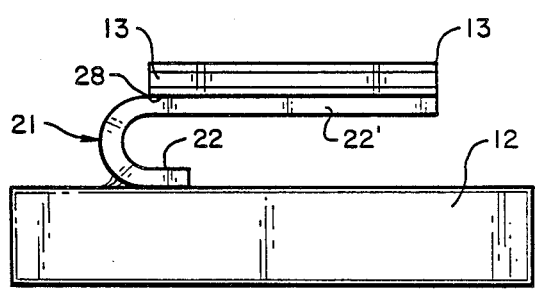

Once contact 21 is affixed to the cover 12, a block 26 of alumina, or the like, is inserted between the cover 12 and the long leg 22' of the contact 21, as shown in FIG. 2b. The diode 13 to be packaged is affixed to the long leg 22' of the contact 21 by soldering with a piece of solder preform 28 shown in FIGS. 2c. The supporting block 26 is then removed, as shown in FIG. 2d.

Figure 2E:
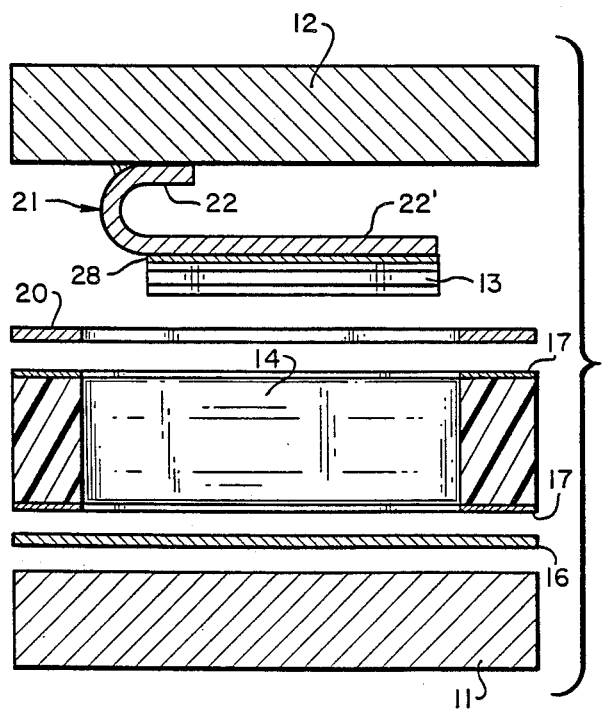

FIG. 2e illustrates in an exploded cross sectional view the final assembly of the diode package wherein the cover 12, with the diode 13 attached, is turned over onto the stacked base plate 11, solder sheet 16, spacing frame 14 with seal rings 17, and solder ring 20. The stacked assembly is then placed in a graphite boat 30, shown schematically in FIG. 4, and placed in an evacuated oven represented by a dashed line 32. The graphite boat is heated by resistive heat generated with DC (or AC) current of sufficient amperage to melt the solder. Once the solder is cooled, the cover 12 is affixed to the spacing ring 14, the spacing ring is affixed to the base 11, and the diode chip 13 is soldered to the base 11 to form a hermetic leadless diode package, with the base 11 and cover 12 serving as contacts for the diode to connect to a circuit where it will be used. The J-shaped contact 21 inside the package will exert a slight pressure on the diode chip 13 to force it against the base plate 11 during the oven heating operation, and forever thereafter. In that way the solder connection of the diode to the base 11, or the contact 21, will not break during handling.

Figure 4:
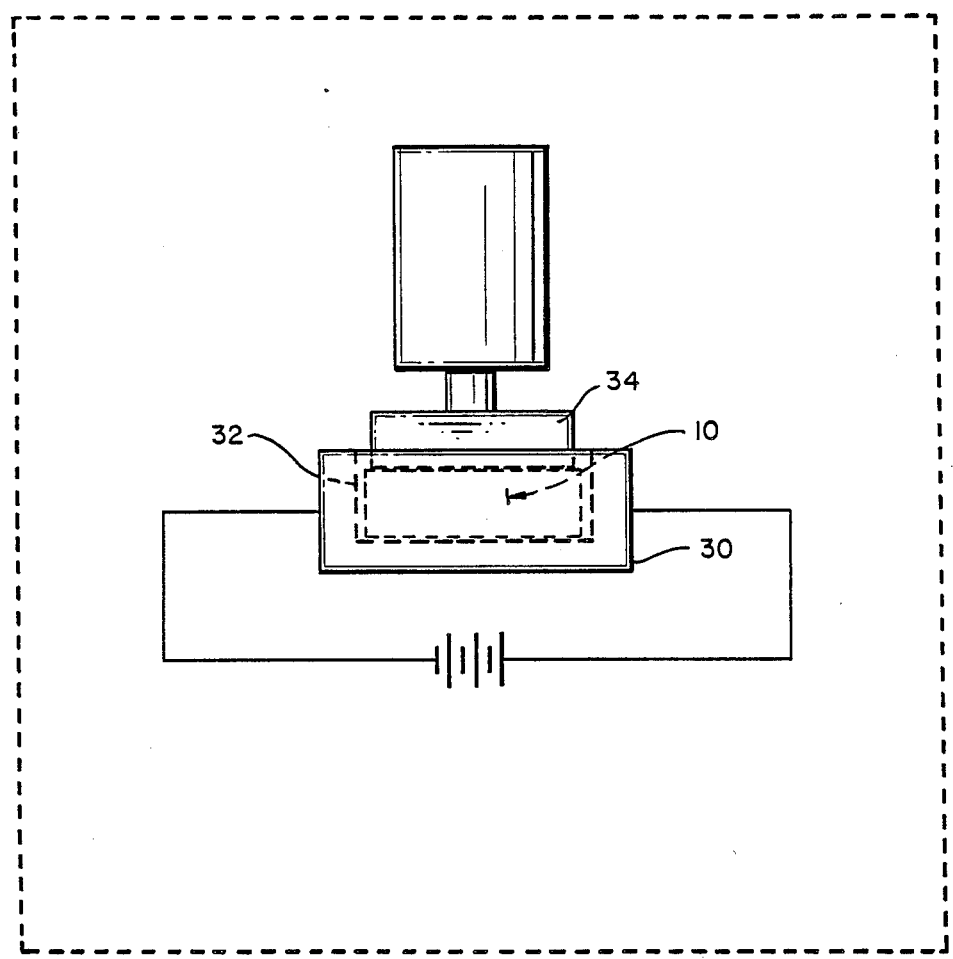
FIG. 4 illustrates a cross section of a hermetic package assembly in a graphite boat placed in an evacuated oven. The boat is heated by current through the graphite, which in turn heats the assembly.

Once the cover 12 is in place on the solder preform 20 and the assembly is placed in the graphite heating boat, a suitable weight 34 shown in FIG. 4 can be placed on the cover 12 to press the assembly together during soldering. Alternatively, clamps may be employed to press the assembly together while heating it in the evacuated oven to about 350° C. for a sufficient time to melt the solder. Since the use of solder preforms is well known and commonly employed, it is not necessary to illustrate and describe the soldering operation in greater detail; it is sufficient to point out that a graphite boat is used for electrical resistance heating in an evacuated oven.

The package thus assembled permits high speed, high amperage switching of diodes due to low inductance of the assembly and high electrical and thermal conductance of the base plate, cover and J-shaped contact. The package is extremely compact, and because it is planar and leadless, it has very low inductance and is ideally suited for use in high frequency circuit applications. The thermal expansion matching of the packaging elements results in improved thermal cycling capability.

Although particular embodiments of the invention have been described and illustrated herein, it is recognized that modifications and variations may readily occur to those skilled in the art. For example, the semiconductor device soldered between two plates may be a transistor or other semiconductor device having a third lead more conventionally provided through an orifice in the dielectric frame. Regarding the method, as distinct from the structure of the semiconductor device, the graphite boat may have a large number of cavities, each just large enough to receive one device package assembly, in order to perform the soldering of a large number of device packages at the same time. Consequently, it is intended that the claims be interpreted to cover such modifications and variations.

What is claimed is:

1. An hermetic leadless package for a planar silicon diode chip, comprising a planar base made of conductive material for forming a first contact to one side of said diode chip, a spacing frame of dielectric material sealed on said base and forming a cavity dimensioned for receiving said diode chip, said diode chip being disposed in said cavity with said one side electrically connected to said base, a cover made of conductive material sealed on said frame for forming a second contact to said diode chip on a side thereof opposite said one side of said diode chip and sealed over said spacing frame, and a spring means made of conductive material disposed between said cover and said diode chip for electrically connecting said cover to a side of said diode chip opposite said one side.

2. An hermetic leadless package for a planar semiconductor diode as defined in claim 1 wherein said spring means is formed from a metal having a coefficient of thermal expansion closely matching the coefficient of thermal expansion of said diode chip, and a thin copper film over said metal to facilitate making an ohmic connection to said semiconductor diode chip.

3. A hermetic leadless package for a planar silicon diode chip, comprising a planar base made of conductive material for forming a first contact to one side of said diode chip, a spacing frame of dielectric material sealed on said base and forming a cavity dimensioned for receiving said diode chip, said diode chip being disposed in said cavity with said one side electrically connected to said base, a cover made of conductive material sealed on said frame for forming a second contact to said diode chip on a side thereof opposite said one side of said diode chip and sealed over said spacing frame, and a spring means mode of conductive material disposed between said cover and said diode chip for electrically connecting said cover to a side of said diode chip opposite said one side, wherein said spring means is formed from a lamination of three metal strips consisting of a core strip of molybdenum and thin surface strips of copper on each side of said core strip.

4. A hermetic leadless package as defined in claim 3 wherein said spring means is formed in a J shape with the shorter leg welded to said cover to form an electrical connection, and the longer leg is soldered to said diode to form an ohmic connection with said semiconductor diode chip.

5. An hermetic leadless package for planar diodes comprising an electrically conductive planar base plate, an electrically conductive planar cover, an electrically insulating spacing frame arranged between said base plate and said cover plate, said spacing frame forming a cavity for receiving a planar diode chip with one side of said diode chip soldered to the inside of said base plate, and a spring contact connected at one end to said cover and at the other end to said planar diode chip to provide an electrical connection between said cover and a side of said diode opposite said one side, said planar diode and spring contact being disposed in the cavity formed by said spacing frame, and said cavity being hermetically sealed by a soldered connection of said spacing frame to said base and to said cover.

6. An hermetic leadless package for planar semiconductor diodes as defined in claim 5 wherein said spring contact is formed from a metal having a coefficient of thermal expansion closely matching the coefficient of thermal expansion of said semiconductor diode, and a thin copper film over said metal to facilitate making an ohmic contact with said semiconductor diode.

* * * * *